United States Patent
Wen et al.

(10) Patent No.: US 7,655,493 B2
(45) Date of Patent: Feb. 2, 2010

(54) MULTI SPECTRAL SENSOR

(75) Inventors: David D. Wen, Los Altos, CA (US); Xinqiao Liu, San Jose, CA (US); Ahn N. Vu, Saratoga, CA (US); Steven Kiyoshi Onishi, San Jose, CA (US)

(73) Assignee: Fairchild Imaging, Inc, Milpitas, CA (US)

( * ) Notice: Subject to any disclaimer, the term of this patent is extended or adjusted under 35 U.S.C. 154(b) by 568 days.

(21) Appl. No.: 11/182,310

(22) Filed: Jul. 14, 2005

(65) Prior Publication Data

US 2007/0015301 A1    Jan. 18, 2007

(51) Int. Cl.
*H01L 21/00*    (2006.01)
*H01L 27/148*   (2006.01)
*H01L 29/768*   (2006.01)

(52) U.S. Cl. .................... 438/48; 257/219; 257/222; 257/226

(58) Field of Classification Search ............. 438/197, 438/48, 73, 80, 372, 548; 257/462, 463, 257/450, 451, 219, 222, 226, 227, 252, 257, 257/258
See application file for complete search history.

(56) References Cited

U.S. PATENT DOCUMENTS

| | | | | |
|---|---|---|---|---|
| 5,835,458 A | * | 11/1998 | Bischel et al. | 369/44.12 |
| 5,946,559 A | * | 8/1999 | Leedy | 438/157 |
| 6,144,206 A | * | 11/2000 | Goldfine et al. | 324/345 |
| 6,864,126 B2 | * | 3/2005 | Kim | 438/142 |
| 7,058,245 B2 | * | 6/2006 | Farahi | 385/14 |

* cited by examiner

*Primary Examiner*—Chuong A. Luu
(74) *Attorney, Agent, or Firm*—Calvin B. Ward

(57) ABSTRACT

A light sensor having a light conversion element between first and second electrodes is disclosed. The light conversion element includes a body of semiconductor material having first and second surfaces. The body of semiconductor material is of a first conductivity type and has doping elements in a concentration gradient that creates a first electrostatic field having a magnitude that varies monotonically from the first surface to the second surface. A bias circuit applies a variable potential between the first and second electrodes to create a second electrostatic field having a direction opposite to that of the first electrostatic field and a magnitude determined by the potential. One of the electrodes is transparent to light in a predetermined band of wavelengths. The body of semiconductor material can include an epitaxial body having a monotonically increasing concentration of a doping element as a function of the distance from one the surfaces.

11 Claims, 5 Drawing Sheets

MULTI SPECTRAL SENSOR

BACKGROUND OF THE INVENTION

Semiconductor imaging arrays form the basis of modern digital cameras. A semiconductor imaging array is an imaging array of pixel sensors in which each pixel generates a signal that measures the amount of light in a predetermined band of wavelengths that strikes the pixel within the exposure time. For example, color imaging arrays typically utilize three different types of pixel sensors that measure the light intensity in three bands, typically red, green, and blue. The individual sensors can be constructed from a single sensor design and wavelength filters that determine the portion of the incident light spectrum that is incident on the sensors. In other sensors, the different sensors have different wavelength sensitivities and filters are not needed.

Originally, digital cameras utilized sensor arrays in which the different sensors are arranged on the sensor surface along side of one another. As a result, the light intensity measured at any given location in the array only provides information on the intensity of light in one band at that location. The intensity of light in another band at that location must be inferred from the sensors for that band in the vicinity of the location in question. Such interpolation limits the resolution of the imaging array and can introduce color artifacts.

Imaging arrays in which multiple detectors are located at each location are also known. In these arrays, several detectors are stacked vertically in the array at each location. Each detector measures the light intensity in a different fixed band that depends on the depth of the detector from the surface of the array. The bands measured by the detectors are fixed at manufacture, and hence, cannot be altered in the field.

SUMMARY OF THE INVENTION

The present invention includes a light sensor having a light conversion element between first and second electrodes. The light conversion element includes a body of semiconductor material having first and second surfaces. The body of semiconductor material is of a first conductivity type and has doping elements in a concentration gradient that creates a first electrostatic field having a magnitude that varies monotonically from the first surface to the second surface. A bias circuit applies a variable potential between the first and second electrodes to create a second electrostatic field having a direction opposite to that of the first electrostatic field and a magnitude determined by the potential. One of the electrodes is transparent to light in a predetermined band of wavelengths. In one embodiment, a body of semiconductor material includes an epitaxial body having a monotonically increasing concentration of the doping elements as a function of the distance from one of the first and second surfaces. In one embodiment, the semiconductor material includes epitaxially grown silicon. In one embodiment, the light conversion element includes a layer of semiconductor material of a second conductivity type between the first electrode and the light conversion element, the second conductivity type being opposite to that of the first conductivity type. The second layer is connected electrically to the body of semiconductor material. In one embodiment, the light conversion element includes first and second insulating implants that limit the movement of charge in one direction parallel to the first surface. In one embodiment, the first electrode includes a plurality of electrically isolated subelectrodes organized into a plurality of columns. Each column includes a shift register for moving charge under the first electrode in a direction parallel to the first surface.

DETAILED DESCRIPTION OF THE PREFERRED EMBODIMENTS OF THE INVENTION

Semiconductor photodetectors operate by detecting the charge generated when a photon is converted to a hole-electron pair in a layer of the semiconductor material. The probability that a photon will be converted after passing through a thickness, t, is proportional to $\exp(-t/\lambda_a)$, where $\lambda_a$ is the absorption length. The absorption length is an approximately exponentially increasing function of wavelength. Hence, a sensor that is just thick enough to convert a significant fraction of the photons in the blue portion of the spectrum will have very little sensitivity in the infrared portion of the spectrum. This effect allows one to construct a sensor that is sensitive to photons in the visible spectrum without the need to compensate for the photons in the infrared portion that are "noise".

Conventional charge coupled devices (CCDs) have photon conversion regions that are approximately 20 microns. For incident light in the infrared ($\lambda$ of 1000 nm and above), the absorption length is approximately 100 microns. Hence, conventional CCDs have poor sensitivity in the infrared.

Since the thickness of silicon is set at manufacture, prior art sensors have fixed wavelength sensitivities. In the case of stacked sensors, the wavelength band that is measured by each sensor is shifted to longer wavelengths as one moves from the top to the bottom of the stack. However, the bands are still fixed. Furthermore, there is a limit to the number of sensors that one can stack, as each sensor requires additional masking and processing steps that increase the cost and lower the device yield.

A sensor in which the absorption depth could be varied to respond to changes would provide a number of advantages. For example, a camera that can take color pictures during the daytime and infrared pictures at night would be useful in numerous surveillance situations. In addition, a camera that could adjust its spectral sensitivity based on a previously taken picture of a scene to provide an enhanced image would also be useful.

Figure 1A:
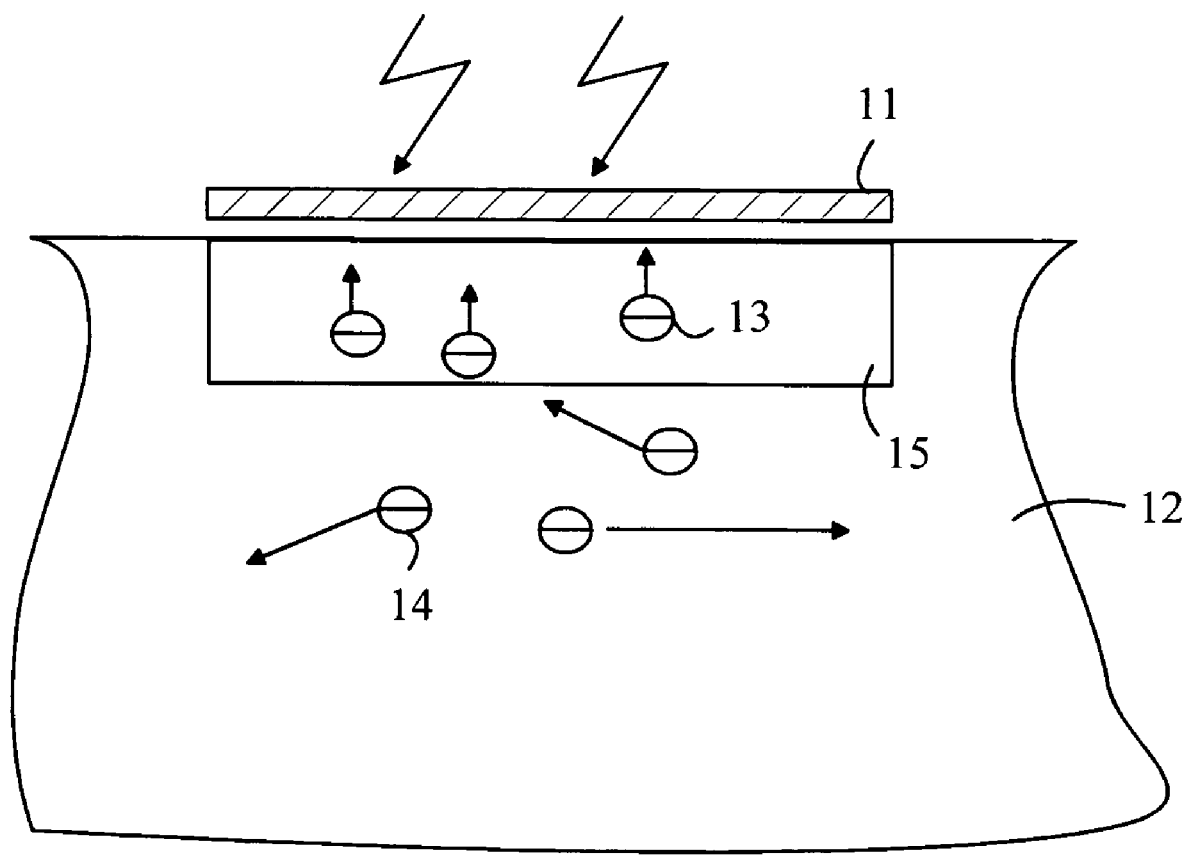
FIG. 1A is a cross-sectional view of the area of silicon in a single pixel of a conventional CCD imaging sensor.

The manner in which a photosensor according to one embodiment of the present invention operates can be more easily understood with reference to FIG. 1A, which is a cross-sectional view of the area of silicon in a single pixel of a conventional CCD imaging sensor. The pixel includes a poly gate 11 that overlies a region of a silicon substrate 12. During charge collection, poly gate 11 is held at a potential relative to the substrate that creates a depletion region 15 under poly gate 11. Poly gate 11 is transparent to light. Photons that enter silicon substrate 12 through poly gate 11 are converted to electrons and holes. Electrons that are generated within depletion region 15, such as electron 13, are collected under poly gate 11. Electrons, such as electron 14, that are created in the neutral region below depletion region 15 migrate until these electrons are collected by a poly gate or recombine with a hole. The poly gate in question can be gate 11 or a poly gate belonging to some other pixel in the array.

Figure 1B:
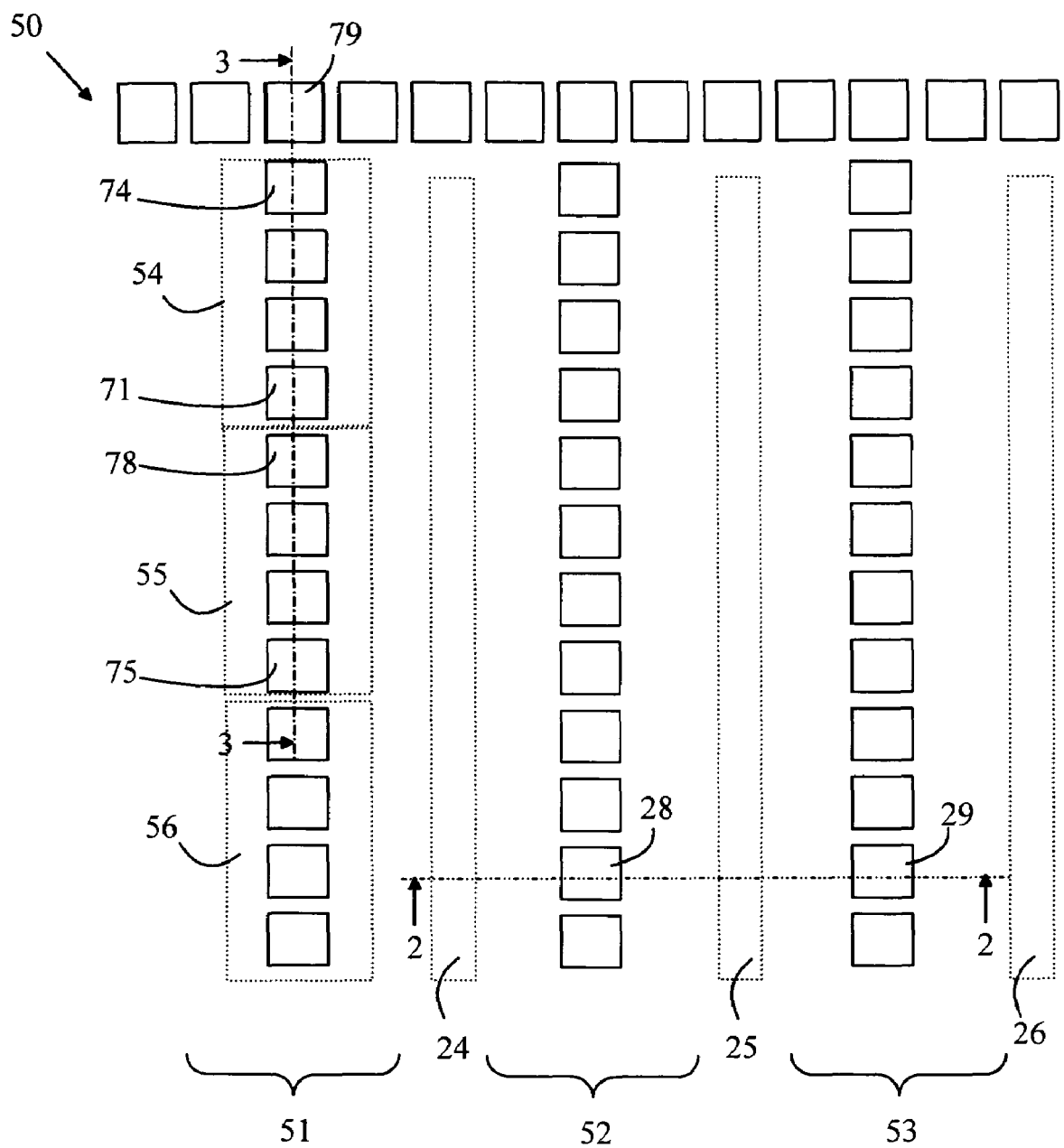
FIG. 1B is a top view of a portion of a CCD imaging array 50 according to one embodiment of the present invention.

The electrons collected under poly gate 11 during the exposure period are measured by shifting the collected charge along a direction perpendicular to the plane of the drawing. Refer now to FIG. 1B, which is a top view of a portion of a CCD imaging array 50 according to one embodiment of the present invention. Imaging array 50 is organized as a plurality of columns of pixel cells. A portion of three of the columns are shown in FIG. 1B at 51-53. Typical pixels are shown at 54-56. In the embodiment shown in FIG. 1B, each pixel cell includes 4 electrodes along the column direction. These electrodes define the pixel boundaries and are used to shift the charge collected at each pixel along the column. The charge packets shifted off of the column are then measured to determine the light that was incident on each pixel. Since the shifting of charge in a CCD array is well known in the art, this process will not be discussed in detail here. For the purpose of this discussion, it is sufficient to note that during the period in which the array is exposed to the image to be measured, charge collects under the middle two electrodes in each cell. After the exposure is completed, the collected charge is shifted down the columns by manipulating the voltages on the various electrodes.

Figure 2A:
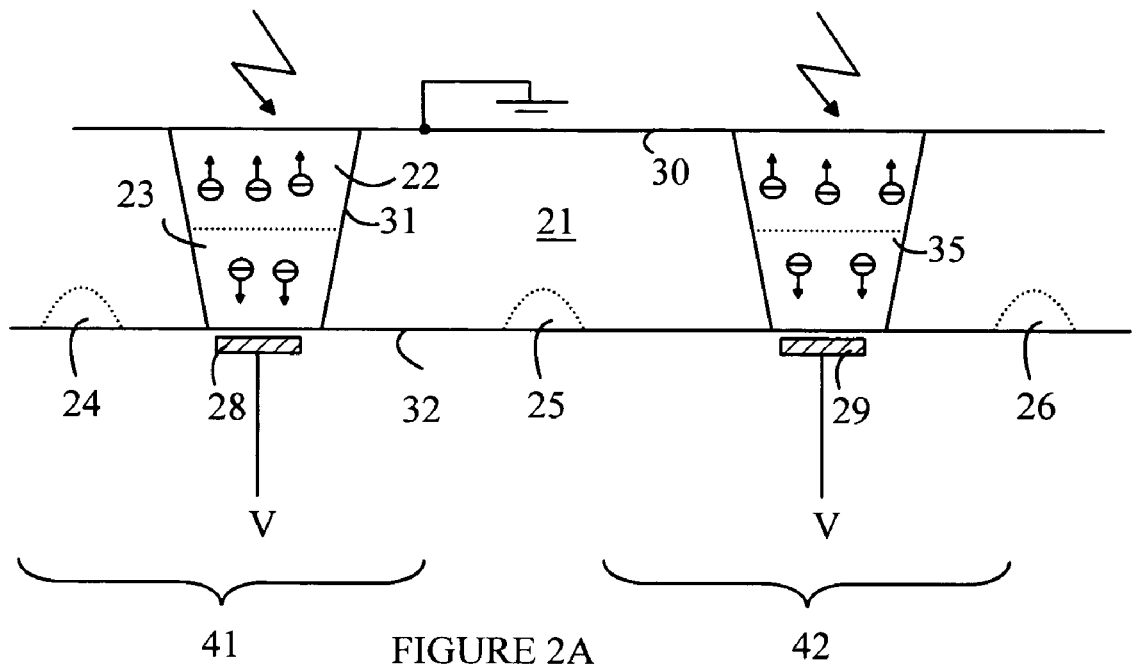
FIG. 2A is a cross-sectional view through line 2-2 shown in FIG. 1B of two pixels in different columns of a CCD sensor according to one embodiment of the present invention.

The present invention is based on the observation that the depth of the depletion region can be controlled by controlling the voltage applied to poly gate 11 if the photo-conversion region of the sensor is properly doped. The manner in which the depth of the depletion region is controlled by the voltage will be discussed in more detail below. Refer now to FIG. 2A, which is a cross-sectional view through line 2-2 shown in FIG. 1B of two pixels 41 and 42 in different columns of a CCD sensor according to one embodiment of the present invention. Pixel 41 is constructed in a silicon substrate 21. Pixel 41 is part of a column of pixels that extends into the plane of the drawing. The light to be measured enters substrate 21 through the back surface of substrate 21, which includes a transparent electrode 30. Poly gates 28 and 29 are fabricated on the front surface of substrate 21. The buried implant regions shown at 24-26 prevent charge from moving from one column to the adjacent columns. Poly gate 28 serves a function analogous to gate 11 discussed above.

The potential on poly gate 28 determines the depth of the depletion region 23. Photons entering the substrate will be converted to electron-hole pairs that originate at the conversion point in the photo-conversion substrate 21. The electrons converted in depletion region 23 are collected under poly gate 28. The electrons generated in region 22 outside of the depletion region migrate until these electrons enter the depletion region of this pixel or a neighboring pixel, or until these electrons recombine with a hole.

The thickness of substrate 21 is chosen such that photons of the longest wavelength of interest will have a predetermined probability of being converted within the substrate. For example, a substrate region that is 300 microns thick will convert photons in the visible and infrared regions of the optical spectrum. The shortest wavelength photons will be converted in the region near electrode 30. The long wavelength photons will be converted over the entire region.

If the voltage on electrode 28 is high, the boundary of the depletion region will be close to surface 30 and essentially all of the electrons generated in the substrate will be collected. If the voltage is reduced, the boundary of the depletion region will move closer to surface 32, only those electrons arising from photons that convert in region 23 will be collected with high efficiency. The electrons arising from photons in region 22 may be collected, but with a much smaller efficiency. Since the short wavelength photons convert at relatively shallow depths, the electrons in region 22 represent the portion of the spectrum in the shorter wavelengths. Hence, the charge collected by poly gate 28 is proportional to a weighted average of the number of photons at each wavelength. The weighting function depends on the voltage on poly gate 28. The weighting function also depends on the thickness of the silicon substrate and other physical parameters. Accordingly, by measuring the charge collected on poly gate 28 as a function of the voltage applied to poly gate 28, the spectrum of the light incident on poly gate 28 can be deduced.

Consider the case in which pixel 41 is part of an imaging array that is used to create a digital image of a scene. If the voltage is increased such that the depletion region includes the entire region 31 between electrode 30 and surface 32, the image will be the average of the images seen in both the visible region and the infrared. As the voltage is decreased, the electrons from photons that convert near electrode 30 will be lost. These are mainly electrons from shorter wavelength photons. Hence, the resulting images will be the average discussed above minus the blue photons. As the voltage is decreased further, the electrons from the green photons will be preferentially lost from the image, and so on. The image generated at very low poly gate voltages will be heavily weighted toward the infrared, since the resulting depletion region will only encompass the region of the substrate that is reached by infrared photons. If a difference image is constructed by subtracting two images taken at different poly gate voltages, the resulting image will represent the image as seen in a band of wavelengths having a location and width that depends on the two poly gate voltages in question.

As noted above, an electron that is generated outside the depletion region migrates until the electron recombines with a hole or until the electron wanders into the depletion zone of one of the pixels in the array. For example, an electron generated in region 22 could migrate into the depletion region 35 of pixel 42. The electrons that end up in the depletion zones generate background noise that interferes with the measurement of the charge of interest. In addition to the electrons that are generated in region 22 from photons that enter that region, there are electrons that are generated in the substrate from thermal collisions and the like, i.e., dark current. These electrons can also migrate into the depletion regions and cause background noise that interferes with the measurement of the charge from photons that are generated in the depletion region. Hence, it would be advantageous to provide a means for reducing the number of such background electrons.

Figure 2B:
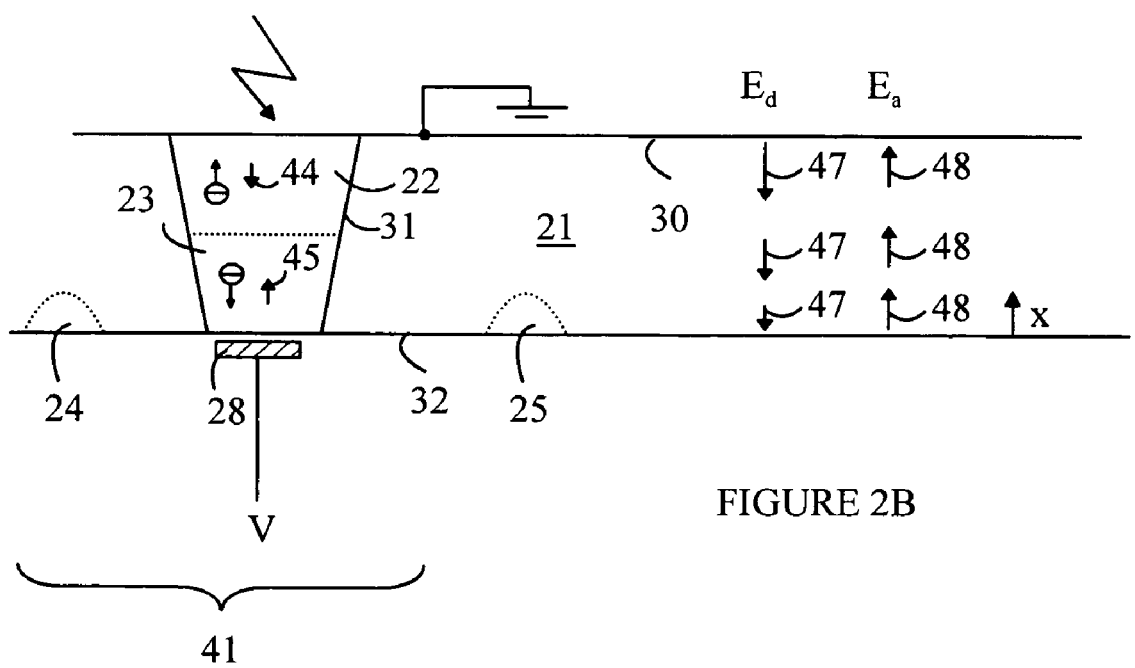
FIG. 2B is a portion of the cross-sectional view shown in FIG. 2A illustrating the manner in which the boundary of the depletion region is controlled by the applied potentials

Refer now to FIG. 2B, which is a portion of the cross-sectional view shown in FIG. 2A illustrating the manner in which the boundary of the depletion region is controlled by the applied potentials. For the purposes of this discussion, it will be assumed that the sensor collects and measures electrons as opposed to holes. Within the depletion region 23, the net electric field points away from surface 32 as shown at 45, and hence, the negatively charged electrons are collected near surface 32. Outside the depletion region, the net electric field points away from electrode 30 as shown at 44, and hence any electrons created in this region are drawn to electrode 30 and away from the depletion region. Hence, the background electrons discussed above are substantially reduced, since these electrons are swept away from the depletion region.

In one preferred embodiment, the net electric field in substrate 21 is the sum of two component electric fields $E_d$ and $E_a$. Electric field $E_d$ is generated by doping substrate 21 with an element in a concentration gradient that gives rise to a variable electric field that points away from electrode 30 and that has a field strength that increases with the distance, x, from surface 32, as shown by the arrows labeled 47. Electric field $E_a$ is generated by the potential between electrode 30 and electrode 28 and gives rise to a substantially constant electric field that points toward electrode 30 and that has a field strength that does not change with the distance, x, from surface 32, as shown by the arrows labeled 48. The magnitude of $E_a$ is determined by the potential difference between electrodes 28 and 30. The depth of the depletion region is related to the point at which $E_a=E_d$. Since $E_d$ varies with x, the depletion depth can be changed by changing $E_a$, i.e., changing the potential between electrodes 28 and 30.

In operation, an image is recorded by first exposing the array to the image for a first time period and then measuring the charge collected at each pixel during a second time period. In the second time period, each of the charges is shifted along the column in which it was collected until the charge reaches the end of the column and is shifted into another shift register that, in turn, shifts the charge to a sense amplifier that performs the actual charge measurement.

A plurality of such images taken at different $E_a$ values can then be combined to form an image emphasizing a particular band of wavelengths of light. Since each image represents the scene as seen over a different spectrum, the images can be combined by forming weighted differences of images taken at the different applied field values. Hence, the same scene can be viewed both in the infrared and visible regions merely by adjusting the bias voltage that is applied between electrodes 28 and 30.

Figure 3:
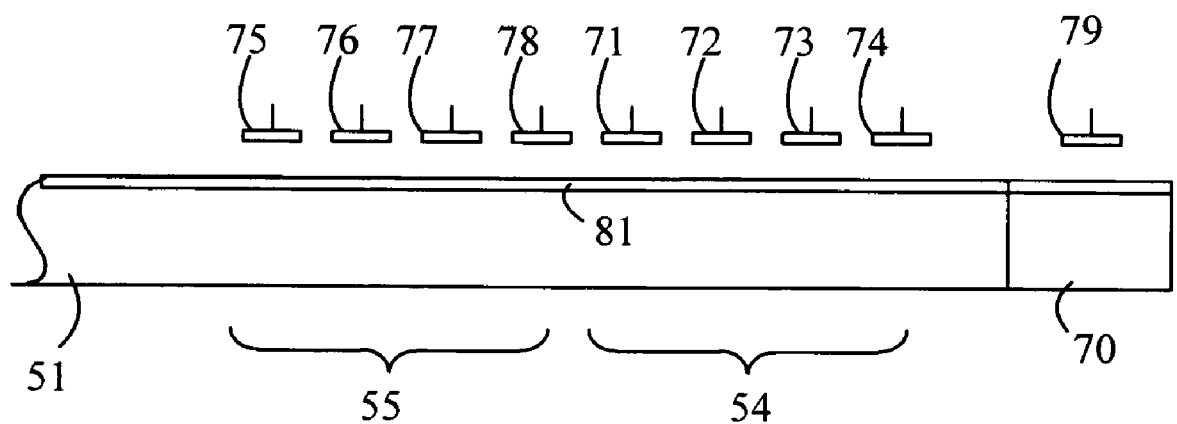
FIG. 3 is a cross-sectional view of a portion of one column of pixels through line 3-3 shown in FIG. 1B.

Refer now to FIG. 3. The manner in which the charge is shifted along column 51 is known to the art, and hence, will not be discussed in detail here. For the purposes of this discussion, it is sufficient to note that each pixel cell in column 51 includes an area of silicon in which the charge moves, and 4 electrodes that set the potential in the silicon area. The electrodes over the silicon of cell 54 are shown at 71-74. At the start of a shift cycle, the electrodes 71 and 74 are at potentials that contain the charge in the region under electrodes 72 and 73. To move the charge into shift register 70, the potential at electrode 72 is altered to force the charge into the region under electrode 74. The potential on electrode 74 is then altered to allow the charge to escape into a corresponding cell in shift register 70. The potential on electrodes 73 and 74 is then sequentially altered to force the charge under these electrodes to move into shift register 70.

During the shift operation, the potentials on electrodes 75-78 associated with cell 55 are likewise manipulated to force the charge in that cell into cell 54. For example, when the potential on electrode 72 is altered to force charge under that electrode to the area under electrode 73, electrode 71 is no longer needed to contain the charge within cell 54. Hence, the potential on this electrode can be altered to allow charge from cell 55 to move under electrode 71. Similarly, when the potential on electrode 73 is altered to move the charge under electrode 74, the potential on electrode 72 is no longer needed to separate the charge in cells 54 and 55, and hence this electrode's potential can be altered to allow the charge from cell 55 to move under that electrode. The potential on the electrodes in cell 55 can then be altered to force the remaining charge from cell 55 to move under electrode 71 thereby completing the shifting of the charge from cell 55 to cell 54 while the charge from cell 54 was shifted into shift register 70 under electrode 79. Once the charges from the end pixels in each of the columns have been shifted into cells in shift register 70, the charges in shift register 70 are shifted out to a readout circuit that is coupled to the last cell in shift register 70.

The above-described shifting scheme requires the charge to move from cell to cell as the voltages on the electrodes are altered as described above. To facilitate this charge movement, an implanted area 81 is included under the electrodes. If the silicon area used to convert the inbound photons to electron-hole pairs is p-doped, area 81 is n-doped and vice versa. This type of implant is known to the art, and hence, will not be discussed in detail here.

Figure 4A:
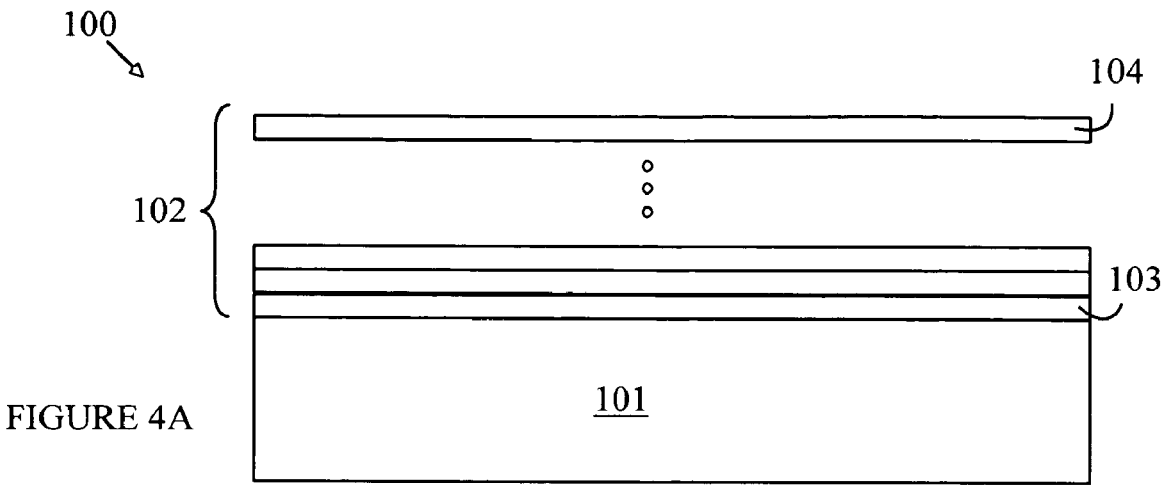
FIGS. 4A-4C are cross-sectional views of a portion of a sensor 100 according to one preferred embodiment of the present invention at various stages in the fabrication process.
Figure 4B:
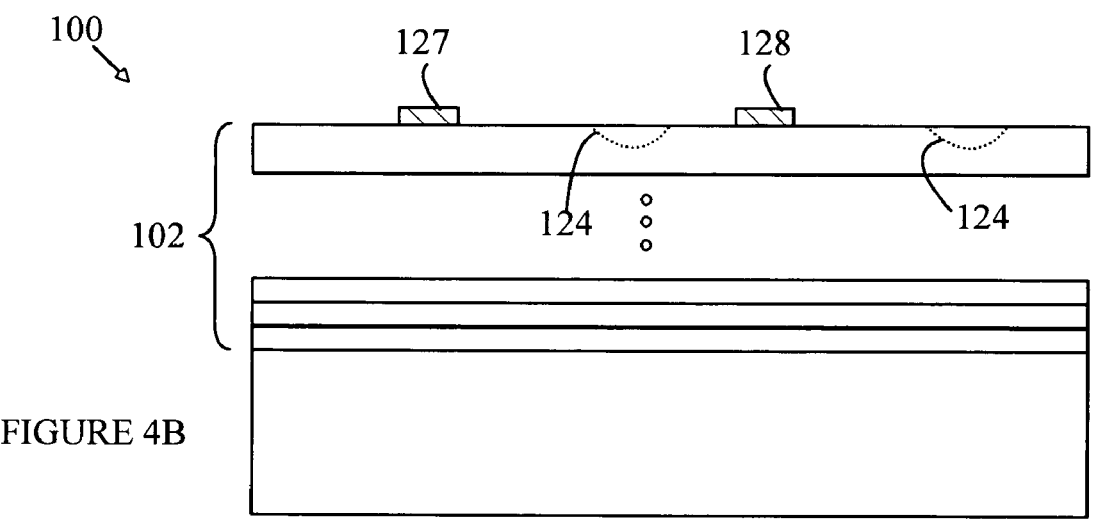
Figure 4C:
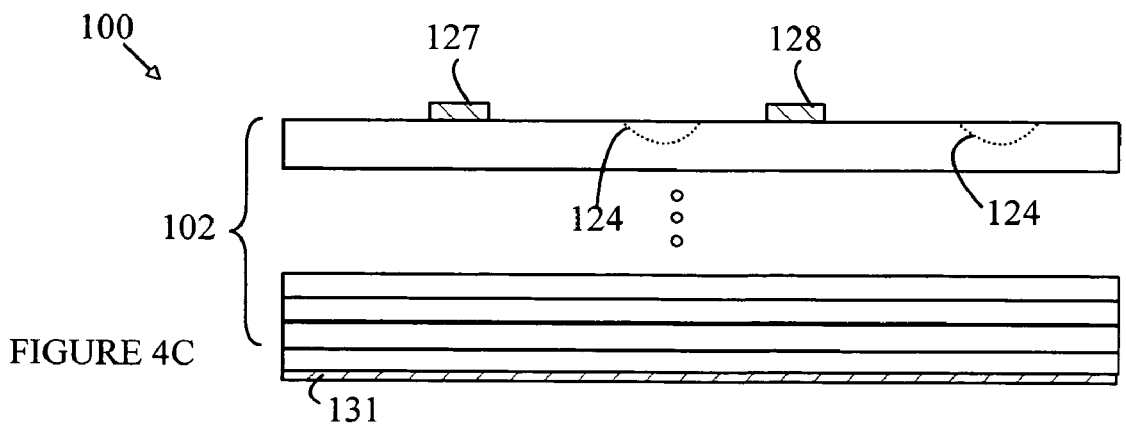

The manner in which a sensor according to the present invention is constructed can be more easily understood with reference to FIGS. 4A-C, which are cross-sectional views of a portion of a sensor 100 according to one preferred embodiment of the present invention at various stages in the fabrication process. Referring to FIG. 4A, a number of p-type layers 102 of epitaxially grown silicon are deposited on a silicon substrate 101. The layers are doped with Boron to form a doping gradient that increases monotonically from layer 103 to layer 104. The doping density varies from $10^{12}$ to $10^{15}$ atoms per $cm^3$ as one moves from layer 103 to layer 104. In one preferred embodiment of the present invention, the stack of epitaxially grown layers 102 is approximately 300 μm thick. While this embodiment utilizes Boron as the doping agent, other doping agents such as Arsenic and Phosphorus can be utilized.

The exemplary embodiment discussed above utilizes discrete layers of epitaxially grown material. However, embodiments in which the body of semiconductor materials has a continuously varying doping gradient can also be constructed. The doping density can be varied continuously by changing the composition of the gases introduced into the growth chamber as a function of time during the deposition process.

Refer now to FIG. 4B. After the doped layers have been constructed, the top layer or layers are implanted with Boron to form the channel barriers 124 which serve functions analogous to those discussed above with reference to implants 24 and 25 shown in FIGS. 2A and 2B. Next, the various electrodes such as electrodes 127-128 are patterned on the top layer.

The bottom surface of substrate 101 is then ground back to the beginning of the epitaxial stack. A transparent conductive electrode 131 such as ITO is then deposited on the bottom surface, leaving the final sensor array as shown in FIG. 4C.

The above-described embodiments of the present invention utilize a static electric field that varies in intensity across the light conversion element and a variable electric field that is constant in amplitude across the light conversion element. The two fields give rise to a depletion region having a boundary that depends on the amplitude of the variable electric field, which is, in turn, determined by the potential across the electrodes. However, in principle, embodiments in which the field generated by the potential across the electrodes varies in amplitude across the light conversion element with a peak amplitude determined by the potential difference can also be constructed. In such cases, the field generated by the doping gradient can be of constant amplitude. Such embodiments, however, are not preferred since the boundary of the depletion zone is not parallel to the boundary of the light conversion element through which the light enters. As a result, determining the spectrum measured at each electrode potential is more complex.

The above-described embodiments of the present invention have utilized a particular readout architecture having 4 electrodes that define each pixel and that are used to move the charge during the charge readout. However, it will be appreciated from the preceding discussion that the present invention can be utilized in many different CCD architectures, since the present invention does not depend on the specific details of a particular CCD architecture to provide its advantages.

The embodiments described above utilize a backside illumination scheme in which the image is introduced through a transparent electrode such as electrode 131 shown in FIG. 4C. However, embodiments in which the image is introduced through the front side of the imaging array, i.e., the side containing electrodes 127 and 128 shown in FIG. 4C can also be constructed provided these electrodes are sufficiently transparent to light in the optical band of interest.

In the above-described embodiments of the present invention the field generated by the doping gradient provides the variable field that allows the depth of the depletion region to be set by setting the voltage across the electrodes on the opposite sides of the silicon layer in which the photons are converted to hole-electron pairs. In addition to this benefit, the doping gradient field provides an additional benefit, namely, the reduction of dark current in the image sensor. A significant number of holes and electrons are generated on the back surface of the silicon substrate even in the absence of light. This dark current is the result of imperfections in the crystal structure at the thinned surface. In the absence of the doping gradient field, some of these electrons would enter the depletion region where these electrons would generate an unwanted background signal that lowers the sensitivity of the imaging sensor. The doping gradient field sweeps these unwanted charges back to the bottom surface electrode where they recombine with holes, and hence, are prevented from creating the unwanted dark current. Accordingly, to provide suppression of this dark current, the present invention is preferably never operated in a mode in which the depletion region extends all the way to the backside electrode.

Various modifications to the present invention will become apparent to those skilled in the art from the foregoing description and accompanying drawings. Accordingly, the present invention is to be limited solely by the scope of the following claims.

What is claimed is:

1. A sensor comprising:
  a light conversion element comprising a body of semiconductor material having first and second surfaces, said body of semiconductor material being of a first conductivity type and having doping elements in a concentration gradient that creates a static electric field in said body of semiconductor material;
  a first electrode and a second electrode, said body of semiconductor material lying between said first and second electrodes; and
  a bias circuit that applies a variable potential between said first and second electrodes to create a variable electric field having a direction opposite to that of said static electric field and a magnitude determined by said potential,
  wherein one of said static electric field and said variable electric field comprises an electric field having a magnitude that varies monotonically from said first surface to said second surface.

2. The sensor of claim 1 wherein said static electric field and said variable electric field generate a depletion region in said body of semiconductor material having a boundary that is a function of said variable potential.

3. The sensor of claim 1 wherein said static electric field has a magnitude that varies monotonically from said first surface to said second surface.

4. The sensor of claim 1 wherein one of said electrodes is transparent to light in a predetermined band of wavelengths.

5. The sensor of claim 1 wherein said body of semiconductor material comprises an epitaxial body having a monotonically increasing concentration of said doping elements as a function of the distance from one of said first and second surfaces.

6. The sensor of claim 1 wherein said semiconductor material comprises epitaxially grown silicon.

7. The sensor of claim 1 further comprising a layer of semiconductor material of a second conductivity type between said first electrode and said light conversion element, said second conductivity type being opposite to that of said first conductivity type, said second layer being connected electrically to said body of semiconductor material.

8. The sensor of claim 1 wherein said doping gradient is generated by an impurity gradient that varies from $10^{12}$ to $10^{15}$ atoms per $cm^3$.

9. The sensor of claim 1 wherein said doping element is chosen from the group consisting of Boron, Arsenic, and Phosphorus.

10. The sensor of claim 1 wherein said light conversion element comprises first and second insulating implants that limit the movement of charge in one direction parallel to said first surface.

11. The sensor of claim 1 wherein said first electrode comprises a plurality of electrically isolated sub-electrodes organized into a plurality of columns, each column comprising a shift register for moving charge under said first electrode in a direction parallel to said first surface.

* * * * *